US005172302A

United States Patent [19]

Taruya et al.

[11] Patent Number: 5,172,302

[45] Date of Patent: Dec. 15, 1992

[54] IGNITION COIL UNIT FOR AN INTERNAL COMBUSTION ENGINE

[75] Inventors: Masaaki Taruya; Mitsuru Koiwa; Nobuyuki Sawazaki, all of Himeji, Japan

[73] Assignee: Mitsubishi Denki K.K., Tokyo, Japan

[21] Appl. No.: 764,876

[22] Filed: Sep. 24, 1991

[30] Foreign Application Priority Data

| | | | |
|---|---|---|---|
| Sep. 28, 1990 | [JP] | Japan | 2-101051[U] |
| Sep. 28, 1990 | [JP] | Japan | 2-101052[U] |
| Sep. 28, 1990 | [JP] | Japan | 2-101053[U] |
| Sep. 28, 1990 | [JP] | Japan | 2-101054[U] |
| Sep. 28, 1990 | [JP] | Japan | 2-101055[U] |

[51] Int. Cl.[5] ............ H05K 7/20

[52] U.S. Cl. ............ 361/386; 123/644; 174/52.2; 363/141

[58] Field of Search ............ 336/96; 363/141, 144; 361/253, 331, 356, 357, 380, 386-389, 392; 307/10.1; 174/52.2, 52.3; 123/198 D, 198 DA, 198 DC, 605, 622, 632, 634, 644

[56] References Cited

U.S. PATENT DOCUMENTS

| | | | |
|---|---|---|---|
| Re. 29,683 | 6/1978 | Ocken, Jr. | 174/52.2 |
| 4,222,089 | 9/1980 | MacAskill, Jr. | 361/263 |
| 4,409,641 | 10/1983 | Jakob | 361/386 |
| 4,872,102 | 10/1989 | Getter | 363/141 |
| 4,899,256 | 2/1990 | Sway-Tin | 361/386 |
| 5,075,822 | 12/1991 | Baumler | 361/388 |

FOREIGN PATENT DOCUMENTS 45432 7/1979 Japan .

*Primary Examiner*—Gerald P. Tolin

*Attorney, Agent, or Firm*—Sughrue, Mion, Zinn, Macpeak & Seas

[57] ABSTRACT

An ignition coil unit comprising within an electrically insulating casing (31) an ignition coil (A) and a packaged power switch circuit (E). The packaged power switch circuit (E), which comprises a plurality of electric and electronic components (F) hermetically sealed within a mold resin (G) to form a single compact unitary piece, is disposed within a power switch cavity (**31*d*) of the casing (31). An aluminum heat dissipating plate (30) may be attached at its first end (30*a*) to said packaged power switch circuit (E) in a thermally conductive relationship and exposed at its second end (30*b*) to the exterior of said casing (31**).

12 Claims, 4 Drawing Sheets

IGNITION COIL UNIT FOR AN INTERNAL COMBUSTION ENGINE

BACKGROUND OF THE INVENTION

This invention relates to an ignition coil unit for an internal combustion engine and, more particularly, to an ignition coil unit in which an ignition coil and a power switch for controlling a primary current through the ignition coil are integrally combined into a unit.

FIG. 6 is an electrical circuit diagram of a known ignition coil unit for an internal combustion engine. The ignition coil unit comprises an ignition coil A having a primary coil 2 and a secondary coil 7, and a power switch circuit B having a plurality of electric and electronic circuit components. In FIG. 6, it is also seen that an electric source C and an ignition signal control circuit D are connected to the ignition coil unit.

The power switch circuit B comprises a power transistor 1 for switching a primary current flowing through the primary coil 2 of the ignition coil A, a current limiting circuit 4 and a current detecting circuit 3 for detecting a potential difference generated by the primary current and for transmitting a primary current control signal to the current limiting circuit 4.

FIG. 7 is a sectional side view of a conventional ignition coil unit in which the ignition coil A and the power switch circuit B are integrally combined, and FIG. 8 is a front view of the ignition coil unit illustrated in FIG. 7 before it is filled with insulating resin. In FIGS. 7 and 8, reference numeral 5 designates a casing, 7 is the secondary coil disposed within the casing 5 and concentrically wound around the primary coil 2 and an iron core 8. The iron core 8 is a substantially C-shaped member having a pair of substantially U-shaped members welded together at an end of one of the legs of the "U" positioned in an opposing relationship. An air gap 8*a* is defined between opposing legs of the "U". Reference numeral 9 is an aluminum, heat dissipating plate attached to the casing 5, the heat dissipating plate 9 having been attached thereto, through an electrically insulating plate 10, the power transistor 1 and the current limiting circuit 4. Reference numeral 11 is a silicone resin hermetically sealing the power transistor 1 and the current limiting circuit 4 for protecting the same and improving heat dissipation, 12 is a connector integrally molded with the casing 5, 13 is a cover for hermetically sealing a power switch cavity 14 in order to ensure the water-resistivity of the power switch circuit including the power transistor 1 and the current limiting circuit 4, and 15 is an electrically insulating resin filled within the casing 5.

Reference numeral 16 is a secondary coil ground line for connecting a first connector terminal 17 and one end of the secondary coil 7, 18 is a source line for connecting a second connector terminal 19 and one end of the primary coil 2, 20 is a control signal line for connecting a third connector terminal 21 and a base terminal 22 of the power transistor 1, 23 is a ground line for connecting a fourth connector terminal 24 and a current limiting circuit terminal 25 of the current limiting circuit 4, and 26 is a collector line for connecting a collector terminal 27 of the power transistor 1 and the other end of the primary coil 2. The control signal line 20, the earth line 23 and the collector line 26 extend through the casing 5 to be connected to the base terminal 22, the current limiting circuit terminal 25 and the collector terminal 27, respectively within the power switch cavity 14.

In the conventional ignition coil unit as described above, the primary current of the primary coil 2 flows through the current detection circuit 3, where the current level is detected as the potential difference upon which a control signal is supplied to the current limiting circuit 4. The current limiting circuit 4 controls, in accordance with this control signal, the primary current flowing through the primary coil 2 of the ignition coil A. In response to this primary current flowing through the primary coil 2, a high voltage to be supplied to a distributor (not shown) is generated in the secondary coil 7 of the ignition coil A.

With the conventional ignition coil unit as described above, the circuit components including the power transistor 1 and the current limiting circuit 4 must be carefully attached to the heat dissipating plate 9 through the insulating plate 10 so that the power transistor 1 and the current limiting circuit 4 are not destroyed. Also, in order that the power transistor 1 and the current limiting circuit 4 are covered with the resin 11 to protect them, the power switch cavity 14 must be provided in the casing 5, preventing a reduction in the dimensions of the ignition coil unit.

Also, since the power switch circuit B is disposed relatively close to the ignition coil A for compactness, the power switch circuit B can be electrically affected by the ignition coil A and erroneously operated.

Further, since the iron core 8 is a substantially C-shaped member having a small gap 8*a* placed inside of the ignition coil A, the distance between the air gap 8*a* and the power switch circuit B is small. Therefore, the power switch circuit B is subjected to heat generated at the air gap 8*a*, a relatively large amount of heat being generated due to a large magnetic reluctance.

Also, although an iron core 8 is provided, a leakage magnetic flux from the ignition coil A may affect the power switch circuit B, causing the power switch circuit B to be erroneously operated.

SUMMARY OF THE INVENTION

Accordingly, one object of the present invention is to provide an ignition coil unit which is simple in operation and easy to assemble.

Another object of the present invention is to provide an ignition coil unit which is reliable.

Another object of the present invention is to provide an ignition coil unit in which the power switch circuit is not electrically affected and erroneously operated by the ignition coil.

A further object of the present invention is to provide an ignition coil unit in which the power switch circuit is not subject to the heat generated from the iron core air gap.

Still another object of the present invention is to provide an ignition coil unit in which the power switch circuit is not affected by the leakage magnetic flux from the ignition coil.

With the above objects in view, the present invention resides in an ignition coil unit comprising an iron core, an ignition coil including a primary coil disposed around the iron core and a secondary coil disposed around the iron core in an electromagnetically coupling relationship with the primary coil. A packaged power switch circuit is provided having a plurality of electric and electronic components including a switching element, a mold resin hermetically sealing and packaging the components into a single unitary piece. The circuit is electrically connected to the ignition coil for controlling an electric current flowing through the primary coil. An electrically insulating casing and filler resin are used for supporting and completely enclosing the ignition coil and the packaged power switch circuit.

BRIEF DESCRIPTION OF THE DRAWINGS

The present invention will become more readily apparent from the following detailed description of the preferred embodiments of the present invention taken in conjunction with the accompanying drawings, in which.

DESCRIPTION OF THE PREFERRED EMBODIMENTS

Figure 1:
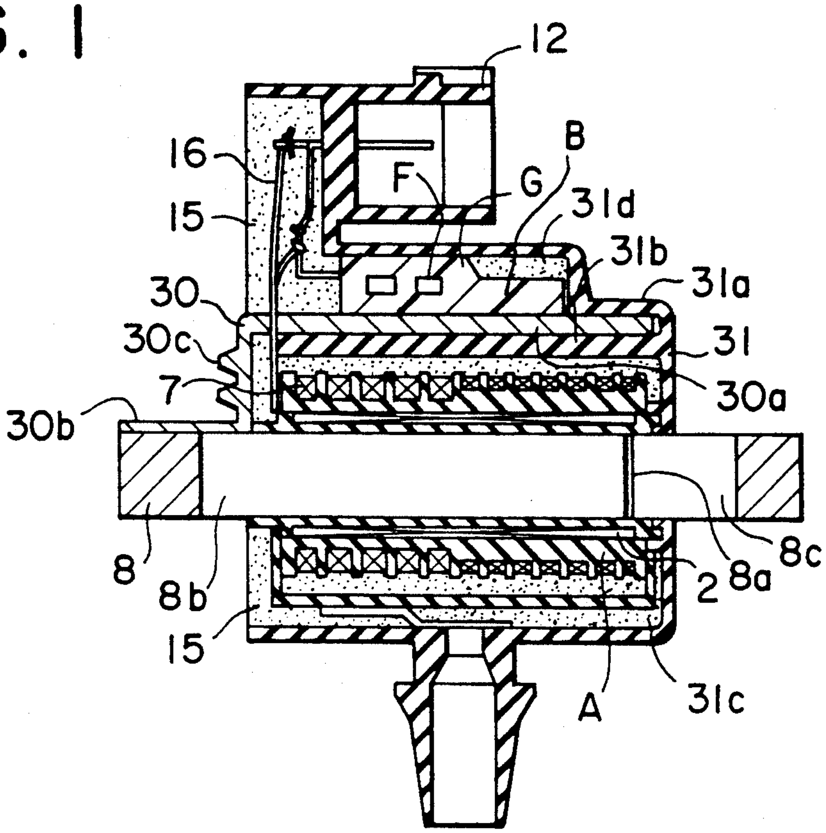
FIG. 1 is a sectional side view of the ignition coil unit for an internal combustion engine of one embodiment of the present invention.
Figure 2:
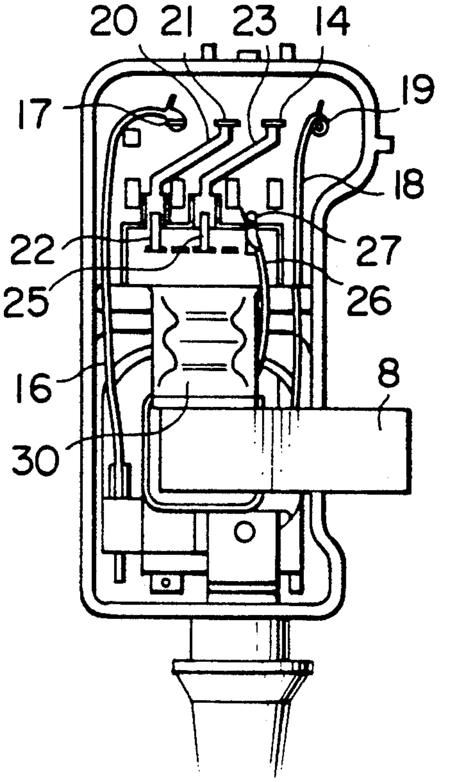
FIG. 2 is a front view of the ignition coil unit illustrated in FIG. 1, showing the unit before it is filled by a filler resin.

FIGS. 1 and 2 illustrate an ignition coil unit of the present invention which comprises an electrically insulating casing 31, an iron core 8, an ignition coil A wound around the iron core 8, a packaged power switch circuit B disposed above the ignition coil A, an electrically insulating casing 31 housing the ignition coil A, the packaged power switch circuit B and a part of the iron core 8. the unit further including an electrical connector 12 for external connection.

The casing 31 comprises an outer wall 31*a* defining a space therein and an inner partition wall 31*b* dividing the space within the outer wall 31*a* into a coil cavity 31*c* for accommodating the ignition coil A therein and a switch cavity 31*d* for receiving the power switch circuit B therein. The casing 31 supports two legs of the substantially C-shaped iron core 8 and it is to be noted that one leg 8*b* of the iron core 8 is much longer than the other leg 8*c* so that the air gap 8*a* between the legs 8*b* and 8*c* is not centrally located with respect to the ignition coil A, but is positioned close to one of axial ends of the ignition coil A. This arrangement allows the power switch circuit B to be relatively remote from the air gap 8*a*, so that the power switch circuit B is not severely affected by the heat generated at the air gap 8*a*.

The ignition coil A is disposed within the coil cavity 31*c* of the casing 31 and around the two opposing legs 8*b* and 8*c* of the iron core 8. The ignition coil A includes a primary coil 2 disposed around the iron core 8 and a secondary coil 7 disposed around the iron core 8 and the primary coil 2 in an electromagnetically coupling relationship with the primary coil 2. The ignition coil A is hermetically sealed by the filler resin 15.

Figure 6:
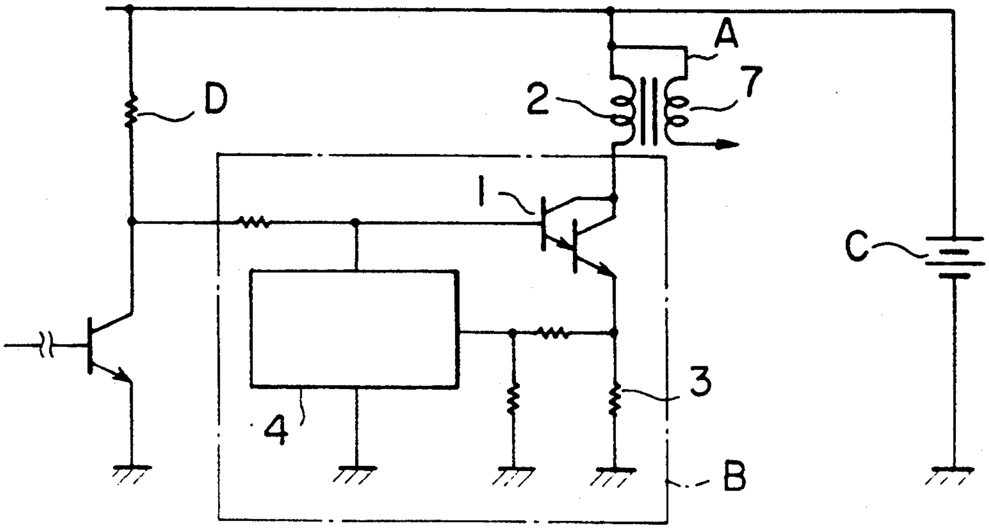
FIG. 6 PRIOR ART
FIG. 6 is a circuit diagram of a conventional ignition coil to which the present invention is applicable.
Figure 7:
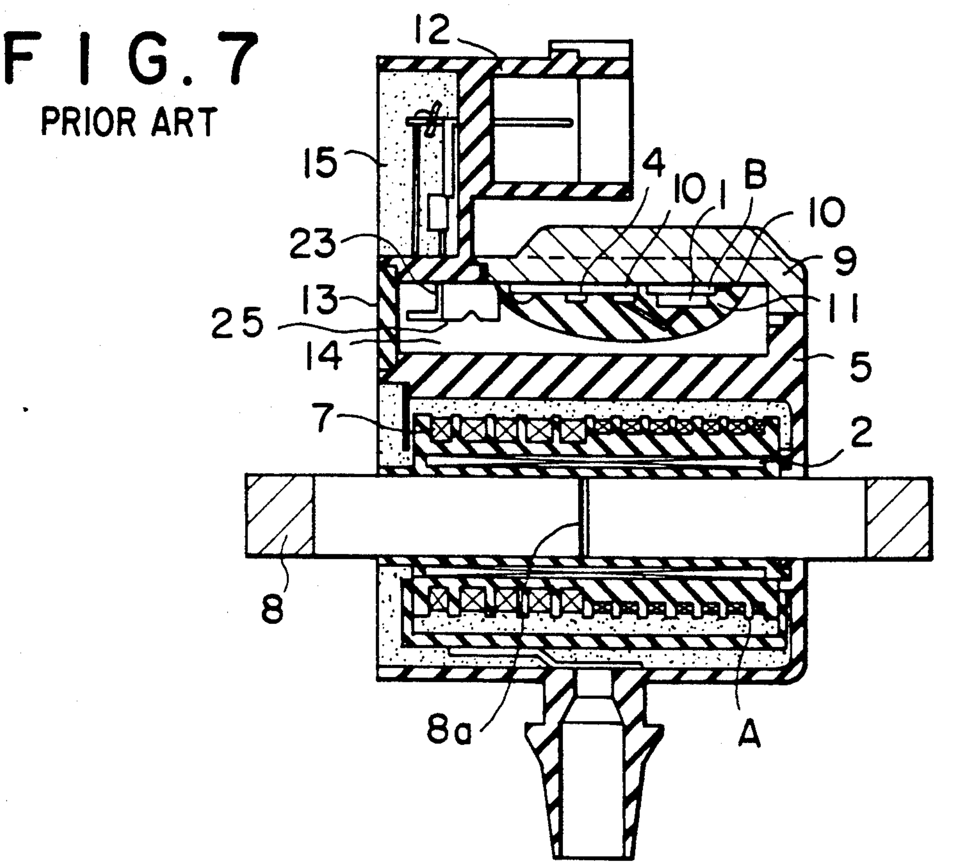
FIG. 7 PRIOR ART
FIG. 7 is a sectional side view of a conventional ignition coil unit in which the ignition coil and the power switch circuit are incorporated into a unitary structure.
Figure 8:
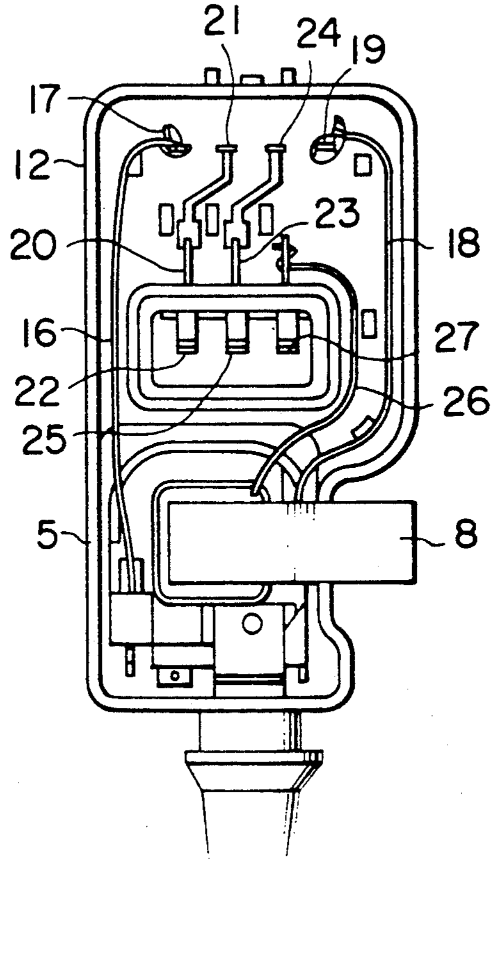
FIG. 8 PRIOR ART
FIG. 8 is a front view of the ignition coil unit illustrated in FIG. 7, showing the unit before it is filled by a filler resin.

The switch cavity 31*d* of the casing 31 accommodates the packaged power switch circuit B therein and is hermetically sealed by the filler resin 15. According to the present invention, the packaged power switch circuit B comprises a plurality of electric and electronic components F including a switching element such as those illustrated in FIG. 6 and a mold resin G hermetically sealing and packaging the components F into a single unitary piece. Since the various electric and electronic components F are packaged within the resin G, the packaged power switch circuit B being handled as an independent components and no further sealing is necessary. Thus, the packaged power switch circuit B is simply inserted into the switch cavity 31*d*. Also, since the various circuit components F are packaged into a compact packaged circuit B, the switch cavity 31*d* is relatively small as compared to the conventional design illustrated in FIGS. 7 and 8. Further, the switch cavity 31*d* is formed from the casing 31, thus making the structure of the casing 31 simple and decreasing the number of assembly steps. The power switch circuit B is electrically connected by the various electrical conductor wires 16 to 27 (see FIG. 2) to the ignition coil A for controlling an electric current flowing through the primary coil 2 and to the electrical connector 12.

The ingnition coil unit of the present invention also comprises a heat dissipating plate 30 having a first end 30*a* physically attached and thermally coupled to the packaged power switch circuit B and a second end 30*b* extended to the exterior of the casing 31. It is seen that the first end 30*a* of the heat dissipating plate 30 is disposed between the ignition coil A and the packaged power switch circuit B with the inner partition wall 31*b* interposed therebetween. The packaged power switch circuit B and the heat dissipating plate 31*b* may be simply placed in the cavity 31*d* or bonded to the casing 31, but they may preferably be bonded to the outer wall 31*a* of the casing 31 or snugly inserted and press-fitted into the switch cavity 31*d*. The extended second end 30*b* of the heat dissipating plate 30 has a bent on which a plurality of cooling fins 30*c* are formed for more efficient cooling. The second end 30*b* of the heat dissipating plate 30 is also electrically connected to the iron core 8. This arrangement allows the power switch circuit B to be protected against the electrical influence due to the ignition coil A because the iron core 8 is grounded through the engine body and is electrically stable when in use. The heat dissipating plate 30 is made of a nonmagnetic material having a low permeability such as aluminum, so that magnetic flux leaked from the ignition coil A can be shielded.

Figure 3:
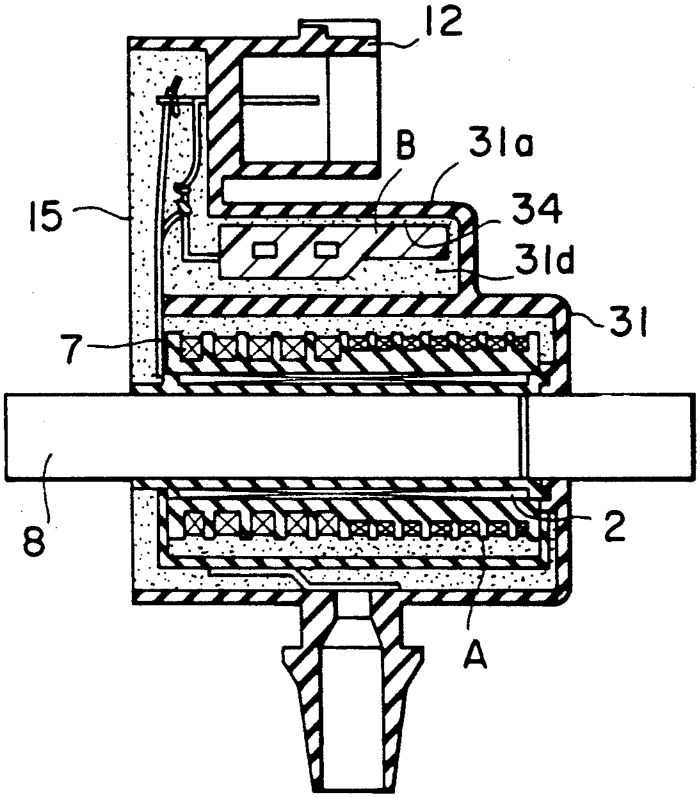
FIG. 3 is a sectional side view of the ignition coil unit of another embodiment of the present invention.
Figure 4:
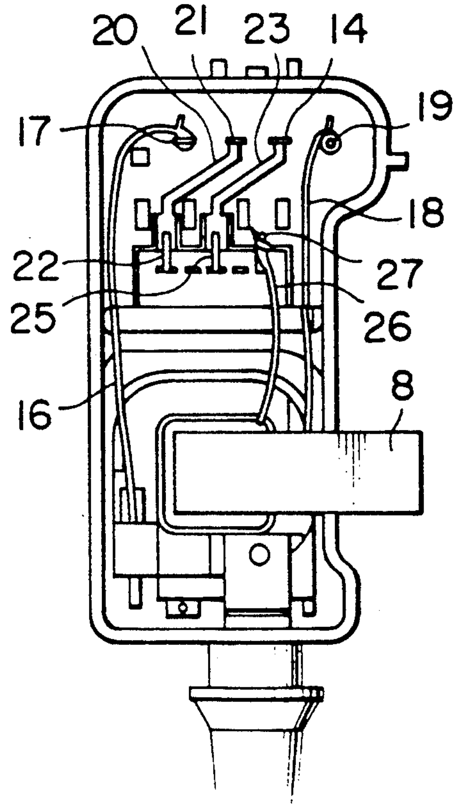
FIG. 4 is a front view of the ignition coil unit illustrated in FIG. 3, showing the unit before it is filled by a filler resin.

FIGS. 3 and 4 illustrate another embodiment of the ignition coil unit of the present invention. In this embodiment, the packaged power switch circuit B is bonded to the inner surface of the outer wall 31*a* of the casing 31 by a thermally conductive bonding agent 34 accordingly, there is no need for a heat dissipating plate as shown in FIG. 1. With this arrangement, the heat generated by the ignition coil A is prevented from being transmitted by conduction through the casing 31 to the heat-sensitive packaged power switch circuit B. The switch cavity 31*d* is filled with a filler resin 15.

Figure 5:
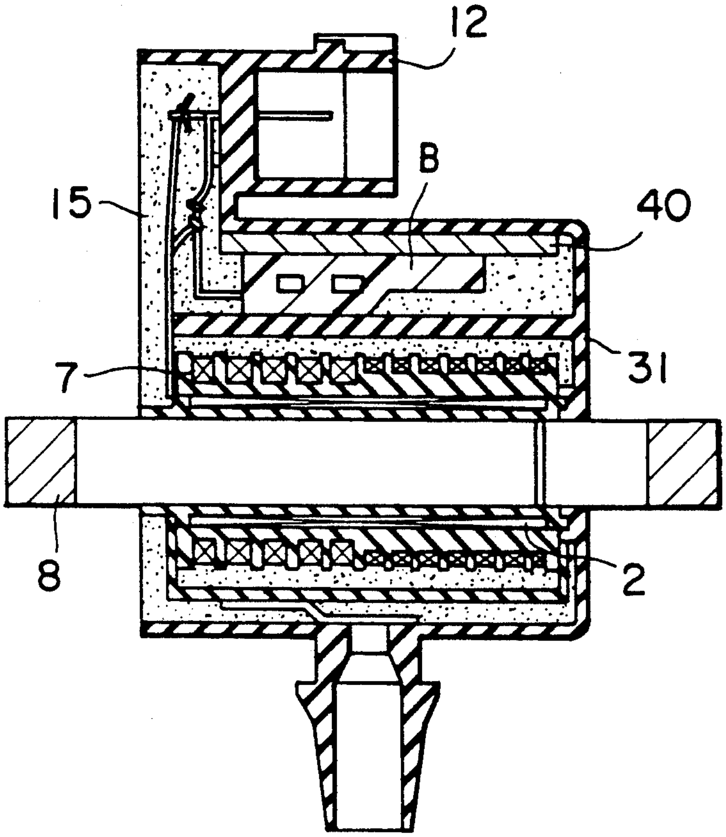
FIG. 5 is a sectional side view of the ignition coil unit of a still another embodiment of the present invention.

In FIG. 5, a heat dissipating plate 40 is inserted between the casing outer wall 31*a* and the packaged power switch circuit H for more effective heat dissipation from the outer wall 31*a*. The packaged power switch circuit B and the heat dissipation plate 40 may be snugly inserted into the switch cavity 31*d* and press-fitted therein.

What is claimed is:

1. An ignition coil unit comprising:

an iron core;

an ignition coil including a primary coil disposed around said iron core and a secondary coil disposed around said iron core in an electromagnetically coupling relationship with said primary coil;

a packaged power switch circuit having a plurality of electric and electronic components, including a switching element, first, and a molded resin (G) hermetically sealing and packaging said components into a single unitary piece, said power switch circuit being electrically connected to said ignition coil for controlling an electric current flowing through said primary coil;

a second filler resin (15); and a unitary, electrically insulating casing, said filler resin and said electrically insulating casing supporting and completely enclosing said ignition coil and said packaged power switch circuit.

2. An ignition coil unit as claimed in claim 1, wherein said casing comprises an outer wall and an inner partition wall together defining therein a coil cavity accommodating said ignition coil therein, and a switch cavity accommodating said packaged power switch circuit therein.

3. An ignition coil unit as claimed in claim 1, further comprising a heat dissipating plate having a first end fixedly secured and thermally coupled to said packaged power switch circuit. and a second end exposed to an exterior of said casing.

4. An ignition coil unit as claimed in claim 3, wherein said second end of said heat dissipating plate is electrically connected to said iron core.

5. An ignition coil unit as claimed in claim 3, wherein said first end of said heat dissipating plate is disposed between said ignition coil and said packaged power switch circuit.

6. An ignition coil unit as claimed in claim 3, wherein said heat dissipating plate is made of a nonmagnetic material.

7. An ignition coil unit as claimed in claim 3, wherein said heat dissipating plate is made of aluminum.

8. An ignition coil unit as claimed in claim 3, wherein said second end has at least one cooling fin.

9. An ignition coil unit as claimed in claim 2, wherein said packaged power switch circuit is attached to said outer wall of said casing within said power switch cavity.

10. An ignition coil unit as claimed in claim 2, further comprising a heat dissipating plate having a first end fixedly secured and thermally coupled to said packaged power switch circuit, and a second end exposed to the interior of said casing, said first end of said heat dissipating plate being disposed between said outer wall of said casing and said packaged power switch circuit.

11. An ignition coil unit as claimed in claim 3, wherein said packaged power switch circuit and said first end of said heat dissipating plate are press-fitted within said power switch cavity.

12. An ignition coil unit as claimed in claim 1, wherein said iron core has an air gap which is remotely located from said power switch element of said packaged power switch circuit.

* * * * *